(12) United States Patent
Xu et al.

(10) Patent No.: US 7,323,256 B2
(45) Date of Patent: Jan. 29, 2008

(54) LARGE AREA, UNIFORMLY LOW DISLOCATION DENSITY GAN SUBSTRATE AND PROCESS FOR MAKING THE SAME

(75) Inventors: Xueping Xu, Stanford, CT (US); Robert P. Vaudo, New Milford, CT (US)

(73) Assignee: Cree, Inc., Durham, NC (US)

( * ) Notice: Subject to any disclaimer, the term of this patent is extended or adjusted under 35 U.S.C. 154(b) by 194 days.

(21) Appl. No.: 10/712,351

(22) Filed: Nov. 13, 2003

(65) Prior Publication Data

US 2005/0103257 A1 May 19, 2005

(51) Int. Cl.
*B32B 9/00* (2006.01)

(52) U.S. Cl. .............. 428/698; 428/336; 428/220; 117/952; 117/953; 257/E31.001

(58) Field of Classification Search ........... 428/698, 428/336, 220; 117/952, 953
See application file for complete search history.

(56) References Cited

U.S. PATENT DOCUMENTS

| | | | |
|---|---|---|---|
| 5,637,531 | A | 6/1997 | Porowski et al. |
| 5,679,152 | A | 10/1997 | Tischler et al. |
| 6,413,627 | B1 | 7/2002 | Motoki et al. |
| 6,440,823 | B1 | 8/2002 | Vaudo et al. |
| 6,447,604 | B1 | 9/2002 | Flynn et al. |
| 6,468,347 | B1 | 10/2002 | Motoki et al. |
| 6,468,882 | B2 * | 10/2002 | Motoki et al. .............. 438/460 |
| 6,488,767 | B1 | 12/2002 | Xu et al. |
| 6,559,075 | B1 | 5/2003 | Kelly et al. |
| 6,648,966 | B2 * | 11/2003 | Maruska et al. ............ 117/101 |
| 6,806,508 | B2 * | 10/2004 | D'Evelyn et al. ........... 257/103 |
| 2002/0189532 | A1 * | 12/2002 | Motoki et al. ............... 117/99 |
| 2003/0080345 | A1 | 5/2003 | Motoki et al. |

(Continued)

FOREIGN PATENT DOCUMENTS

EP 966047 A2 * 12/1999

(Continued)

OTHER PUBLICATIONS

S. Porowski, et al., J.Cryst. Growth, vol. 78, 174, (1997).

(Continued)

*Primary Examiner*—Jennifer McNeil
*Assistant Examiner*—Timothy M. Speer
(74) *Attorney, Agent, or Firm*—Vincent K. Gustafson; Intellectual Property Technology Law; Julio Garceran

(57) ABSTRACT

Large area, uniformly low dislocation density single crystal III-V nitride material, e.g., gallium nitride having a large area of greater than 15 cm$^2$, a thickness of at least 1 mm, an average dislocation density not exceeding 5E5 cm$^{-2}$, and a dislocation density standard deviation ratio of less than 25%. Such material can be formed on a substrate by a process including (i) a first phase of growing the III-V nitride material on the substrate under pitted growth conditions, e.g., forming pits over at least 50% of the growth surface of the III-V nitride material, wherein the pit density on the growth surface is at least 10$^2$ pits/cm$^2$ of the growth surface, and (ii) a second phase of growing the III-V nitride material under pit-filling conditions.

50 Claims, 13 Drawing Sheets

U.S. PATENT DOCUMENTS

2003/0145783 A1    8/2003    Motoki et al.
2004/0251471 A1    12/2004   Dwilinski et al.

FOREIGN PATENT DOCUMENTS

| EP | 1 249 522 A2 | 10/2002 |
| EP | 1 453 159 A1 | 9/2004 |
| JP | 2001200366 A * | 7/2001 |
| WO | WO-02/01608 A2 | 1/2002 |
| WO | WO-03/043150 A1 | 5/2003 |

OTHER PUBLICATIONS

M. Bockowski, J. Cryst. Growth, vol. 246, 194 (2002).

M.K. Kelly, et al., Jpn. J. Appl. Phys.. vol. 38, pp. L217-L219, (1999).

Xu, et al., J. Electronic Materials, vol. 31, 402, (2002).

J. Crystal Growth, vol. 246, 223 (2002) and Physica Status Solidi ( c ), (2003).

D'Evelyn, M.P. et al., Growth and Characterization of Bulk GaN Crystals at High Pressure and High Temperature, Mat. Res. Soc. Symp. Proc. vol. 798, pp. 275-279, 2004, Materials Research Society.

Hiramatsu, Kazumasa, et al., Fabrication and characterization of low defect density GaN using facet-contolled epitaxial lateral overgrowth (FACELO) , J. Crys. Growth, Dec. 2000, pp. 316-326, vol. 221, No. 1-4.

Motoki, Kensaku, et al., Preparation of large GaN substrates , Mater Sci. Eng. B, May 30, 2002, pp. 123-130, vol. 93, No. 1-3.

Vennegues, P., et al., Reduction mechanisms for defect densities in GaN using one- or two-step epitaxial lateral overgrowth methods, J. Appl. Phys., May 1, 2000, pp. 4175-4181, vol. 87, No. 9.

* cited by examiner

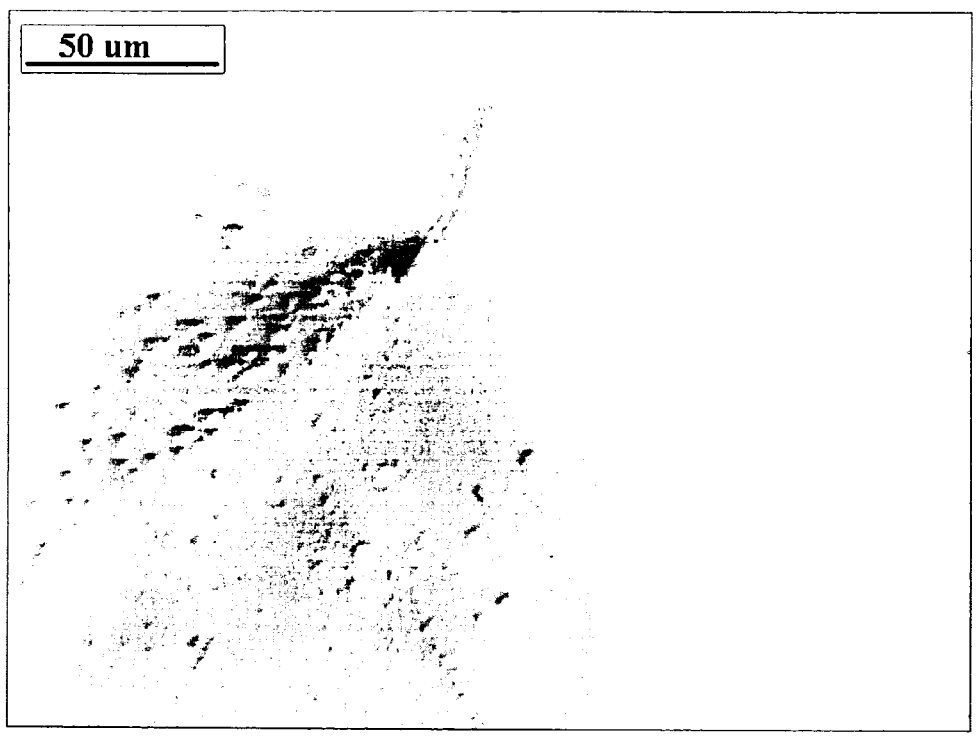
FIG. 8
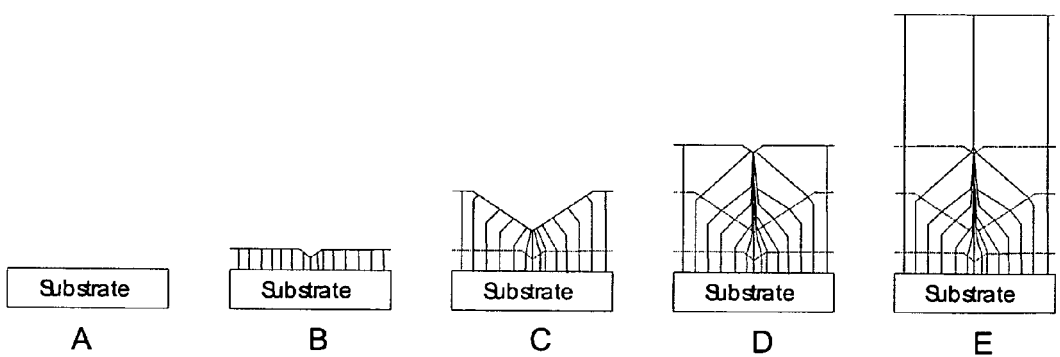
FIGS. 9A-E

大 AREA, UNIFORMLY LOW
DISLOCATION DENSITY GAN SUBSTRATE
AND PROCESS FOR MAKING THE SAME

BACKGROUND OF THE INVENTION

1. Field of the Invention

The present invention relates to large area, uniformly low dislocation density gallium nitride material, such as is useful in the manufacture of microelectronic and opto-electronic devices, such as light emitting diodes, laser diodes, opto-electronic sensors, opto-electronic switches, high electron mobility transistors, etc., as well as a method for making such gallium nitride material.

2. Description of the Related Art

Gallium nitride (GaN) and related III-V nitride alloys have applications in light emitting diodes (LED) and laser diodes (LD) and in electronic devices. The performance of the GaN-based device strongly depends on the crystal defects of the device layer, especially the density of threading dislocations. For blue and UV laser diodes, a dislocation density of less than $3 \times 10^6$ cm$^{-2}$ is preferred for longer lifetime. Furthermore, GaN devices grown on native gallium nitride substrates are preferred for improved device performance and simplified design and fabrication.

Gallium nitride substrates can be prepared by various methods. Porowski et al. U.S. Pat. No. 5,637,531 discloses a method of growing bulk GaN at high nitrogen pressure. Metallic gallium is reacted with gaseous nitrogen to form gallium nitride crystals at the surface of the gallium melt. A temperature gradient is provided in the reactor vessel, resulting in supersaturation of nitrogen atoms in the cooler region of the reactor, and growth of gallium nitride crystals. The growth pressure in the Porowski et al. process is about 10 kbar and growth temperature is about 1400° C. The dislocation density of material produced by the Porowski et al. process is as low as 100 cm$^{-2}$, however, the maximum size of the GaN produced by this method has been limited to about 10 mm platelets (S. Porowski and I. Grzegory, J. Cryst. Growth, Vol 178, 174 (1997), M. Bockowski, J. Cryst. Growth, Vol 246, 194 (2002)).

Hydride vapor phase epitaxy (HVPE) has been utilized to produce gallium nitride substrates. Tischler et al. discloses in U.S. Pat. No. 5,679,152 a method of producing single crystal GaN substrates by first growing a thick GaN film on a compatible sacrificial substrate and then etchably removing the sacrificial base substrate at a temperature near the growth temperature to produce the freestanding GaN substrate. Another method of separating the grown gallium nitride film from the substrate is to optically induce decomposition at the interface between the grown film and the substrate. Kelly et al. discloses in U.S. Pat. No. 6,559,075 a method for separating two material layers by using laser energy to decompose the interface layer. For GaN grown on sapphire substrates, a laser with energy larger than the bandgap of GaN, but smaller than the bandgap of sapphire, is used. When the laser shines through the sapphire substrate, the laser energy is absorbed at the GaN-sapphire interface. With sufficient laser energy density, the GaN in the interface region is decomposed into metallic gallium and gaseous nitrogen, thereby separating the GaN film from the sapphire substrate. A freestanding GaN wafer almost 2" in diameter was produced using this method (see, for example, M. K. Kelly et al., Jpn. J. Appl. Phys. Vol. 38, pp. L217-L219, 1999). Motoki et al. discloses in U.S. Pat. No. 6,413,627 a method of making a single crystal GaN substrate material, by first growing a thick GaN film on a gallium arsenide substrate and then eliminating the substrate. The dislocation density for the typical HVPE gallium nitride is about $1 \times 10^7$ cm$^{-2}$.

Motoki et al. in U.S. Pat. No. 6,468,347 and U.S. Published Patent Applications 2003/0080345 and 2003/0145783 describe methods to produce gallium nitride single crystal substrates with low dislocation density in certain areas but high dislocations in other areas. The high dislocation density areas are disclosed as being randomly distributed, or distributed in a predetermined pattern, e.g., in the form of periodic stripes, with the low dislocation density regions dispersed between the high dislocation density areas. In U.S. Pat. No. 6,468,347, Motoki et al. thought the GaN material produced had low dislocation density, but in U.S. Published Patent Applications 2003/0080345 and 2003/0145783, Motoki et al. clarified that material produced by the process disclosed in U.S. Pat. No. 6,468,347 had high dislocation density area randomly dispersed in the low dislocation density area. In U.S. Published Patent Application 2003/0080345, Motoki et al. disclosed methods to place the high dislocation density areas in a predetermined pattern as periodic dots. In U.S. Published Patent Application 2003/0145783, Motoki et al. disclosed methods to place the high dislocation density area in the form of periodic stripes.

The presence of high dislocation density areas on the GaN substrate necessitates precise alignment of the device structure on the low defect areas. Furthermore, the non-uniform distribution of defects may adversely affect the growth of the device layer on the GaN substrate.

Vaudo et al. U.S. Pat. No. 6,440,823 teaches the use of pitted growth to collect and annihilate dislocations, as well as high surface morphology conditions to subsequently close the pits.

Since the performance of the GaN-based laser diodes and other devices is critically dependent on the nature and extent of crystal defects in the device layer, which in turn depends on the defect structure and morphology of the GaN substrate, there is a compelling need for uniformly low dislocation density GaN substrates. Furthermore, low-cost manufacturing of GaN-based devices requires large area substrates. The prior art has failed to provide uniformly low dislocation density, large area GaN substrates.

SUMMARY OF THE INVENTION

The present invention relates to large area, uniformly low dislocation density gallium nitride, and process for making same.

In one aspect, the invention relates to large area single crystal III-V nitride material with uniformly low dislocation density on at least one surface thereof.

In another aspect, the invention relates to large area, uniformly low dislocation density single crystal gallium nitride, having a large area of greater than 15 cm$^2$, a thickness of at least 0.1 mm, an average dislocation density not exceeding $1 \times 10^6$ cm$^{-2}$, and a dislocation density standard deviation ratio of less than 25%.

Another aspect of the invention relates to an article, including large area single crystal III-V nitride material with uniformly low dislocation density on at least one surface thereof.

A further aspect of the invention relates to a wafer including large area single crystal gallium nitride material with uniformly low dislocation density on at least one surface thereof.

In another aspect, the invention relates to an electronic device article, including a wafer comprising large area single crystal gallium nitride material with uniformly low dislocation density on at least one surface thereof, and an electronic device structure fabricated on such wafer.

Additional aspects of the invention relate to large area single crystal III-V nitride material, e.g., GaN, with uniformly low dislocation density on at least one surface thereof, as grown under single crystal III-V nitride growth conditions slightly deviated from optimal single crystal III-V nitride growth conditions, as well as to wafers formed of such material.

Yet another aspect of the invention relates to a vapor phase growth process for forming a large area, uniformly low dislocation density single crystal III-V nitride material on a substrate, such process including (i) a first phase including one or more steps of growing the III-V nitride material on the substrate by a vapor phase growth technique under pitted growth conditions, and (ii) a second phase including one or more steps of growing the III-V nitride material by the vapor phase growth technique under pit-filling conditions effecting closure of pits and annihilation of defects on a growth surface of the III-V nitride material.

A further aspect of the invention relates to a vapor phase growth process for forming a large area, uniformly low dislocation density single crystal III-V nitride material on a substrate, such process including (i) a first phase of growing the III-V nitride material on the substrate by a vapor phase growth technique under pitted growth conditions forming pits over at least 50% of the growth surface of the III-V nitride material wherein the pit density on the growth surface is at least $100/cm^2$ of the growth surface at the end of the first phase, and (ii) a second phase of growing the III-V nitride material under pit-filling conditions that fill the pits to produce an essentially pit-free surface.

Other aspects, features and embodiments of the invention will be more fully apparent from the ensuing disclosure and appended claims.

BRIEF DESCRIPTION OF THE DRAWINGS

FIG. 8 is a DIC optical image of a GaN surface after CMP and etching with hot phosphoric acid. The GaN was grown under pitted growth conditions to a thickness of 5 mm. After CMP and hot phosphoric acid etching, the dislocations are decorated as etching pits. The distribution of the pits is not uniform.

FIGS. 9A-9E are a series of schematic illustrations showing the growth of a GaN substrate article according to one embodiment of the present invention, including provision of a substrate (FIG. 9A), growth of GaN under pitted growth conditions producing smaller pits in the GaN film on the substrate, with lines perpendicular to growth surface representing threading dislocations (FIG. 9B), continued growth wherein the pits grow larger, concentrating the dislocations under the pitted growth conditions (FIG. 9C), growth of GaN under pit-filling conditions, wherein pits grow smaller under the pit-filling growth conditions, partially annihilating the dislocations, until pits are completely filled and all dislocations meet at the moment of pit closure, leaving a few dislocations remaining (FIG. 9D), and further growth of defect-free GaN to produce the product uniformly low dislocation density large area GaN material (FIG. 9E).

FIG. 10B, focusing under the surface of the same area as FIG. 10A) of the dislocation distribution of a GaN wafer according to the present invention. The dislocations were decorated as etch pits by chemical mechanical polish and hot phosphoric acid etching. The image in FIG. 10A shows the top surface and the image in FIG. 10B is focused under the surface with different contrast to highlight the differences of the material under the surface. The circles indicate pit-filling growth underneath the surface. The width of each image was 250 µm.

DETAILED DESCRIPTION OF THE INVENTION, AND PREFERRED EMBODIMENTS THEREOF

Figure 1:
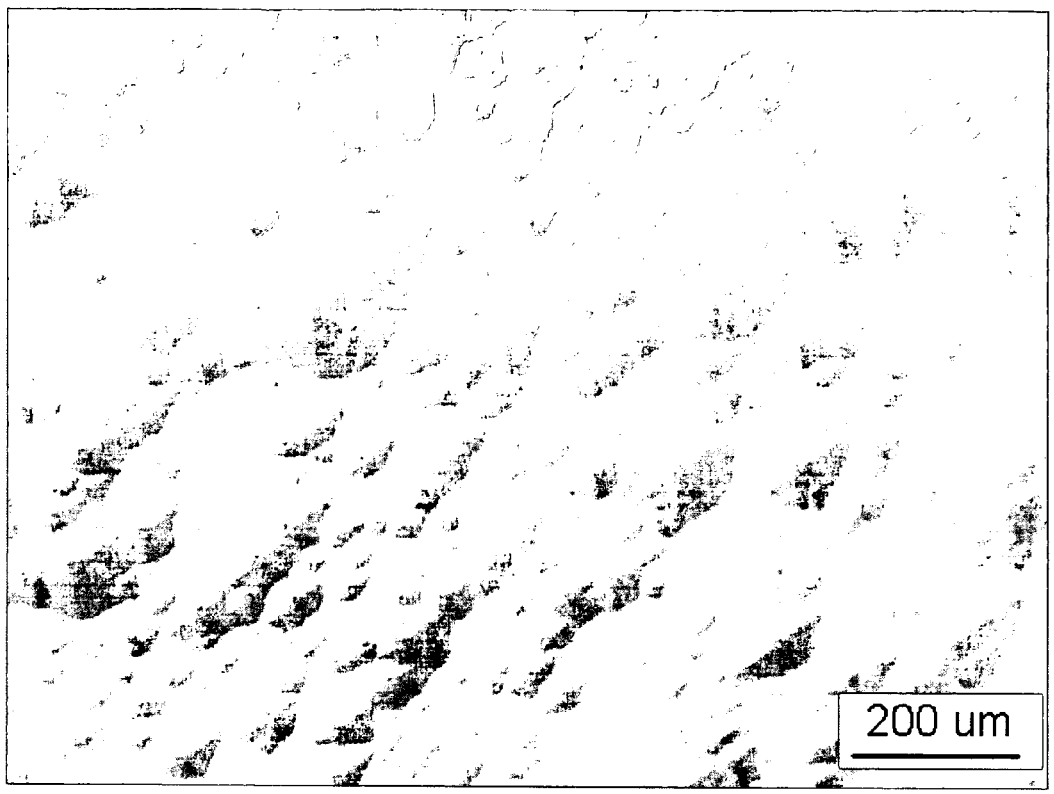
FIG. 1 is a differential interference contrast (DIC) optical micrograph of a textured surface morphology of HVPE GaN film grown on a sapphire substrate under optimized growth conditions including a growth temperature of 1030° C., an $NH_3$/HCl ratio of 30, a growth time of 1 hour, and a growth rate of 116 microns/hour.

The present invention relates to uniformly low dislocation density and large-area gallium nitride substrates and methods of making the same.

As used herein, the term "large area" in reference to the gallium nitride substrate article of the present invention, means that such article has a surface area of at least 2 $cm^2$. In preferred practice, the large area gallium nitride substrate article of the present invention has a surface area for GaN epitaxial growth thereon, that is greater than 15 $cm^2$. The thickness of such large area, low dislocation density GaN material may be any suitable thickness, and preferably is at least 0.1 millimeter (mm).

As used herein, the term "low dislocation density material" refers to GaN or other III-V nitride material having a dislocation density not exceeding $3\times10^6/cm^2$ of growth surface area. In preferred practice of the invention, the dislocation density of the uniformly low dislocation density large area material does not exceed about $1\times10^6/cm^2$, and most preferably such dislocation density does not exceed $1\times10^5$ dislocations/$cm^2$ on the large area growth surface of the substrate.

As used herein, the term "uniformly low dislocation density" in reference to the gallium nitride or other III-V nitride single crystal, low dislocation density material of the invention, means that such material on its large area growth surface has dislocations distributed randomly and uniformly on such large area surface.

For example, in randomly selected measurement areas (50 μm×50 μm, for instance), the density of the dislocations and the distribution of the dislocations in the randomly selected areas are similar to one another. It will be appreciated that the total area measured on the large area surface must be sufficiently large so that the dislocation density is measured in a statistically significant manner, and the randomly selected measurement areas within such total area must be small enough to exhibit sensitivity to small-scale periodic variation. If many dislocation density measurements are statistically sampled in randomly selected locations over large areas, the average of the measurements and standard deviation of the measurements are obtained.

The average of the dislocation density measurements determined in this manner for the GaN or other III-V nitride single crystal material of the invention on its large area growth surface, hereafter referred to as average dislocation density (ADD), does not exceed $3\times10^6$ $cm^{-2}$ and the dislocation density standard deviation ratio, hereafter referred to as DDSDR, determined as (standard deviation of the dislocation density of randomly selected locations over the large area)/(average dislocation density), preferably is less than 50%. In various specific embodiments of the invention, the ADD more preferably is below $1\times10^6$ $cm^{-2}$ and the DDSDR more preferably is less than 25%. Still more preferably, the DDSDR is less than 10%, and most preferably the DDSDR is less than 5%. Dislocation density can be measured with a transmission electron microscope (TEM). Alternatively, dislocations can be decorated as etch pits by chemical mechanical polishing and/or etching in hot phosphoric acid, and the density of the etch pits can be measured with an optical microscope, or a scanning electron microscope (SEM) or an atomic force microscope (AFM) (Xu et al., J. Electronic Materials, Vol 31, 402, 2002, J. Crystal Growth, Vol 246, 223 (2002), and Physica Status Solidi (c), 2003).

As used herein, the term "essentially pit-free surface" as applied to the growth surface of the single crystal III-V nitride material at the conclusion of the pit-filling growth in the method of the invention, means a surface having a pit density not exceeding 3 pits/$cm^2$ of surface area. The term "pit," as used herein, refers to cavities, depressions, localized indentations, and similar surface artifacts on the growth surface. Pits frequently, but not invariably, will have crystallographic boundaries, e.g., hexagonal or dodecagonal boundaries in the case of c-plane growth, but may also be formed with geometrically irregular boundaries or boundaries of other conformations.

The present invention achieves a uniformity of low dislocation density on a large area gallium nitride substrate, which the prior art has been unable to obtain. By providing a large area growth surface having a low level of randomly and uniformly distributed dislocations, the present invention achieves a substantial advance in the art, since microelectronic devices can be fabricated anywhere on such large area surface, without concern for high defect regions such as are characteristic of prior art practice. In such prior art practice, the existence of localized high defect regions severely limits the freedom and flexibility of the integrated circuitry fabrication, and any registration of microelectronic and/or optoelectronic device structure with such high defect regions can render the ultimate microelectronic and/or opto-electronic device deficient or even useless for its intended purpose.

Large area, uniformly low dislocation density gallium nitride material may be formed in accordance with the present invention utilizing any suitable growth technique, e.g., hydride vapor phase epitaxy (HVPE), metal-organic vapor phase epitaxy (MOVPE), metal-organic chloride method (MOC), sublimation, molecular-beam epitaxy (MBE), gas source MBE, metal-organic MBE, sputtering, reactive sputtering, reactive sublimation, etc. In addition, any combination of one or more techniques either together or in sequence may be considered a suitable growth technique. In general, any suitable vapor phase growth method may be employed that effectively delivers growth species for GaN film formation to the gallium nitride growth surface.

Accordingly, while the ensuing disclosure will be directed primarily to vapor phase formation of large area, uniformly low dislocation density GaN by HVPE, it will be appreciated that such disclosure is of an illustrative character only, and that the use of alternative film growth techniques is contemplated in the broad practice of the present invention.

In the use of HVPE processing to form large area, uniformly low dislocation density GaN in accordance with the present invention, the GaN growth rate, film morphology and material quality are selectively optimizable by appropriate selection of ammonia flow rate, hydrogen chloride flow rate and growth temperature, for the specific reactor configuration that is employed, as is readily determinable within the skill of the art based on the disclosure herein. It will therefore be recognized that exact growth parameters for achieving the uniformly low dislocation density, large area gallium nitride material of the invention will vary with the specific vapor phase deposition reactor that is employed to form the GaN material of the invention. The optimization of the GaN growth process may for example be carried out by a design of experiments (DOE) approach where several parameters are varied, or by varying one of the ammonia flow rate, HCl flow rate and growth temperature parameters while keeping the other parameters constant and determining the GaN growth rate, film morphology and material quality that are thereby achieved for the GaN film, and repeating such iterative change of process conditions for the second and third parameters (of the ammonia flow rate, HCl flow rate and growth temperature parameters) in turn, to establish an optimal set of process conditions, from which conditions can be determined that produce the desired uniformly low dislocation density, large area GaN material in successive process stages of pit-forming growth and pit-filling growth, as hereinafter more fully described.

The surface morphology of GaN films formed by the vapor phase HVPE process will strongly depend on the growth conditions, particular the growth temperature and $NH_3$:HCl ratio. Two characteristic surface morphologies are observed for crystalline gallium nitride films grown by HVPE. FIG. 1 shows one typical textured surface morphology of gallium nitride film grown on a sapphire substrate at optimal growth temperature and $NH_3$/HCl ratio. The specific optimized growth conditions for growth of this GaN surface included a growth temperature of 1030° C., an ammonia to hydrogen chloride ratio, $NH_3$:HCl, of 30 and a growth rate of 116 μm/hr. As shown in FIG. 1, the GaN surface produced under these optimized GaN growth conditions exhibited hillock surface morphology.

Figure 2:
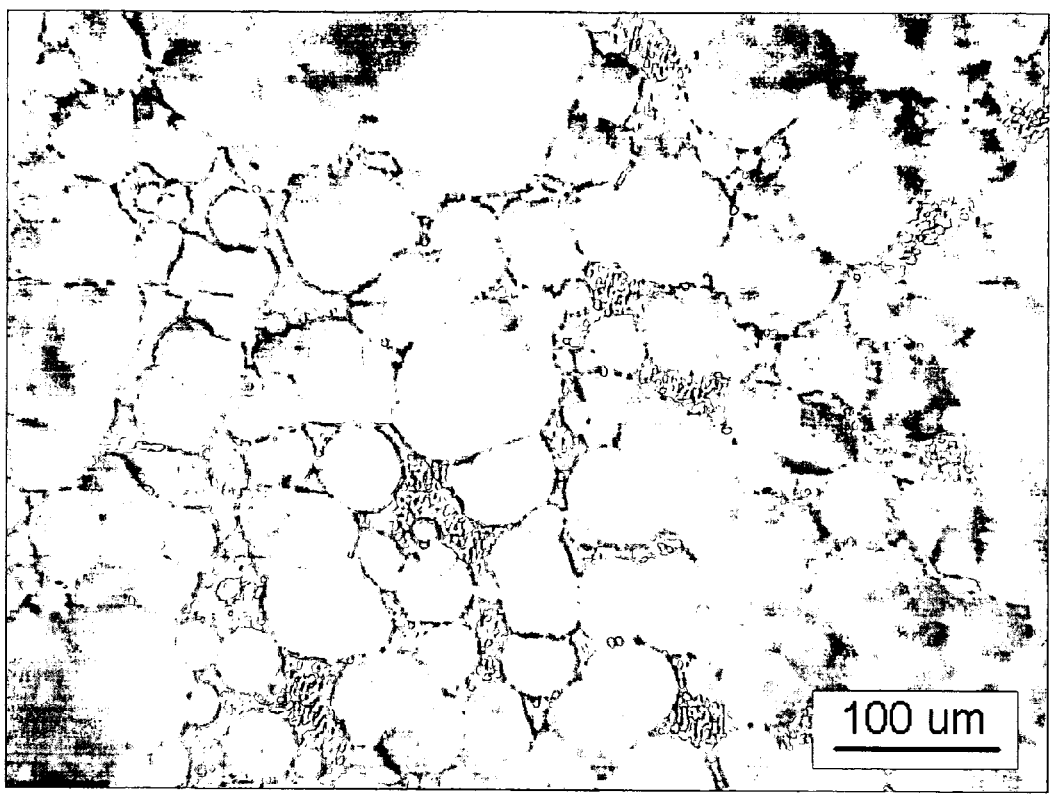
FIG. 2 is a DIC optical micrograph of a pitted surface morphology of HVPE GaN film grown under conditions of slightly higher $NH_3$ flow than the optimal condition, wherein the growth temperature was 1030° C., the $NH_3$/HCl was 58, the growth time was 1 hour, and the growth rate was 268 microns/hour.

FIG. 2 shows a pitted surface morphology of HVPE GaN film that is typical of GaN material that is grown under conditions of slightly lower temperature, or slightly higher ammonia flow (higher $NH_3$:HCl ratio), or both slightly lower temperature and slightly higher ammonia flow (higher $NH_3$:HCl ratio), than is employed in the optimal process conditions. Although the surface exhibits pits in this suboptimal regime of lower temperature and/or higher ammonia flow rate than the optimal process conditions, the GaN film exhibits single crystalline character and the extent of pitting is desirably at a high level, so that as much of the growth surface as possible is covered with pit formations. The pit-forming phase of the growth process of the present invention is desirably carried out to yield a pit density on the growth surface of the GaN material that is at least 100 pits/$cm^2$ of growth surface area, preferably being greater than 500 pits/$cm^2$ of growth surface area at the end of the pitted growth phase.

FIG. 2 is an optical micrograph image of a GaN surface grown under the following pit-forming growth conditions: growth temperature=1030° C., $NH_3$:HCl ratio=58, growth time=1 hour and growth rate=268 microns/hour.

After the growth of a self-supporting thickness of GaN on a compatible substrate, the substrate can be removed to yield a freestanding GaN wafer blank. The freestanding GaN wafer blank then may be subjected to post-growth processing steps, such as lapping, polishing, and chemical mechanical polishing (CMP) to produce the finished GaN wafer, as more fully described in Xu et al. U.S. Pat. No. 6,488,767. The surface morphology of the CMP-finished GaN wafer is related to the morphology of the wafer blank prior to processing.

Figure 3:
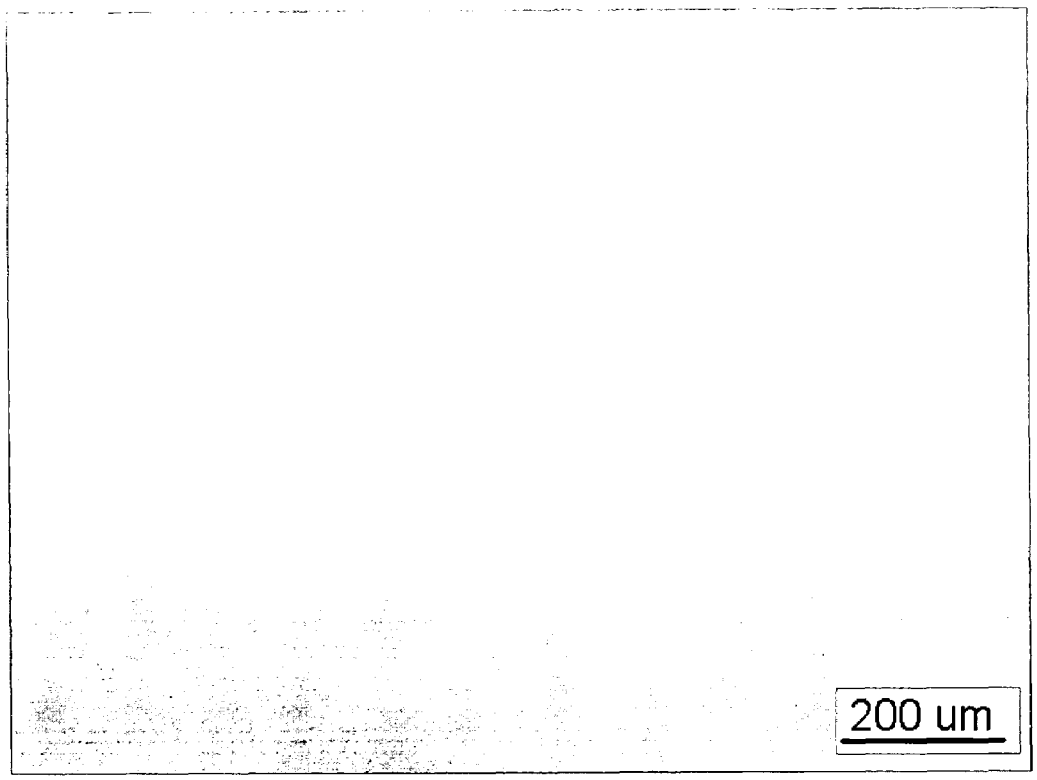
FIG. 3 is a DIC optical image of a GaN surface after mechanical polish and chemical mechanical polish (CMP) finish, wherein the as-grown wafer blank prior to such polishing and CMP exhibited a pit-free textured surface, similar to the one shown in FIG. 1.

FIG. 3 is a differential interference contrast (DIC) optical microscope image of a CMP-finished GaN wafer. The starting as-grown wafer blank had a pit-free textured surface morphology, similar to the surface morphology shown in FIG. 1. As shown in FIG. 3, the CMP-finished wafer was very smooth and featureless.

Figure 4:
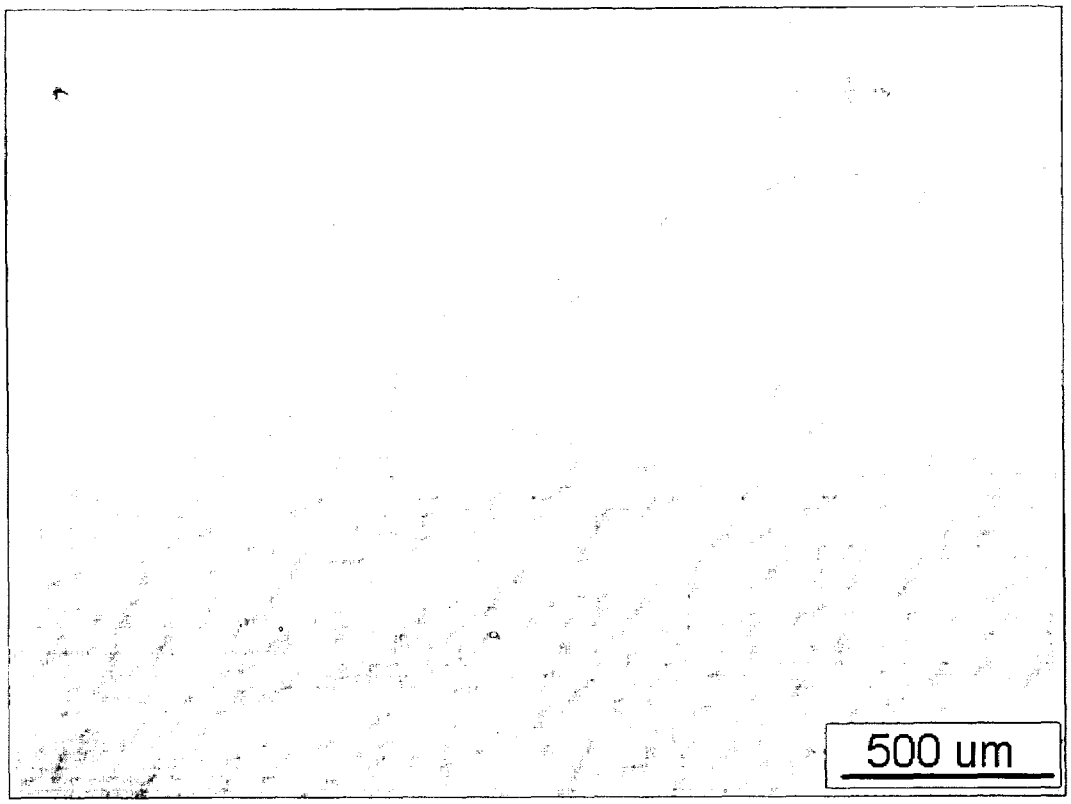
FIG. 4 is a DIC optical micrograph of a GaN surface after mechanical polish and CMP finish, wherein the as-grown wafer blank prior to such polishing and CMP exhibited a high density of pits on the surface, similar to the surface shown in FIG. 2, and the pits were removed during polish.

On the other hand, if the starting as-grown GaN wafer blank has a pitted surface morphology, the CMP-finished wafer is not featureless. FIG. 4 is a differential interference contrast (DIC) microscope image of a pitted GaN wafer after lapping, mechanical polishing and CMP finishing. Even though the pits are completely removed during the mechanical polishing step, the CMP-finished wafer surface appears to have two regions, one of which is recessed slightly below the other. The shape and size of the recessed regions are very similar to the shape and size of the pits that were present during growth at the same cross-section. The recessed region corresponds to the material growth in the pits, in a growth direction along the facets of the pits and the other region corresponds to the material that is grown in a growth direction along the c-axis.

There is a subtle difference between the material grown in the respective different growth directions. The impurity concentration is higher for the material grown along the surface of the pits than in the material grown along the c-axis. The rate of chemical mechanical polishing of the respective materials is correspondingly slightly different, with the material grown with the growth direction along the facets of the pits having a higher removal rate than the material grown along the c-axis, leading to the observed indentation. Even the microscopic crystal growth direction inside the pits is along the facets of the pits, and the surface is still a c-axis surface after removing the pits by polish and CMP. The degree of indentation can be minimized by using a smaller grit diamond material in the mechanical polishing step prior to the CMP step, and shorter CMP processing time.

These two surface regions (one region corresponding to the material growth in the pits, in a growth direction along the facets of the pits, and the other region corresponding to the material grown in a growth direction along the c-axis) also have slightly different catholuminescence (CL) properties.

Figure 5:
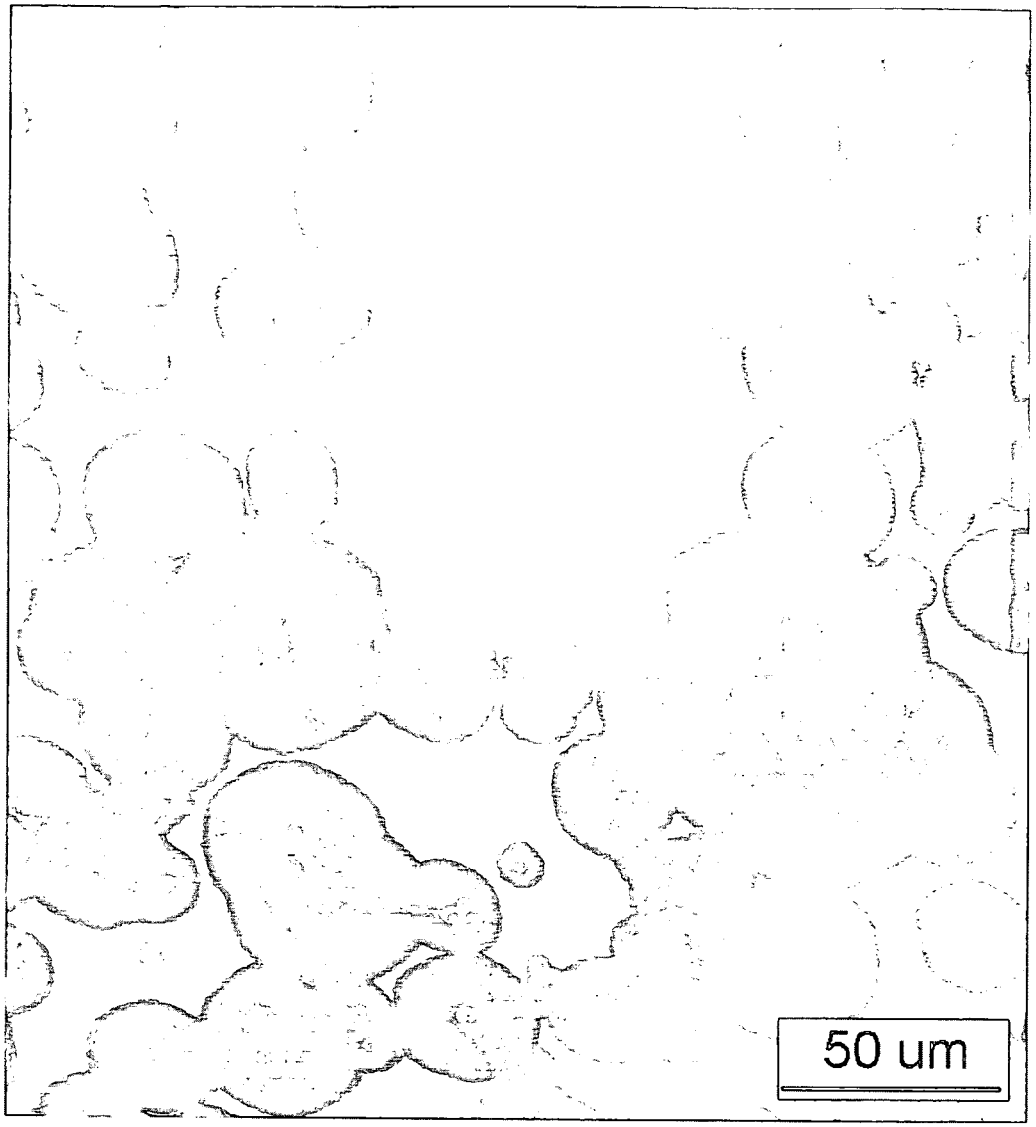
FIG. 5 is a room-temperature total-intensity catholuminescence image of a GaN surface having a morphology similar to that of the FIG. 4 GaN wafer, wherein the dark spots correspond to crystalline defects. The surface was polished mechanically and finished with a CMP process.

FIG. 5 is a room-temperature total-intensity catholuminescence image of a GaN surface, as polished mechanically and finished with a CMP finishing process. FIG. 5 thus reflects a mapping of total room temperature catholuminescence intensity for a CMP-finished GaN wafer having a morphology similar to the wafer whose optical micrograph is shown in FIG. 4. The surface has two regions that have different catholuminescent properties. The recessed area exhibited a high total CL intensity at room temperature.

The crystalline defects (dislocations) in the material shown in FIG. 5 are observable in the CL mapping as dark spots corresponding to dislocations. The dislocations are concentrated near the center of the recessed area. The chemical mechanical polishing process also decorates the threading dislocations as pits that are observable by AFM.

Figure 6:
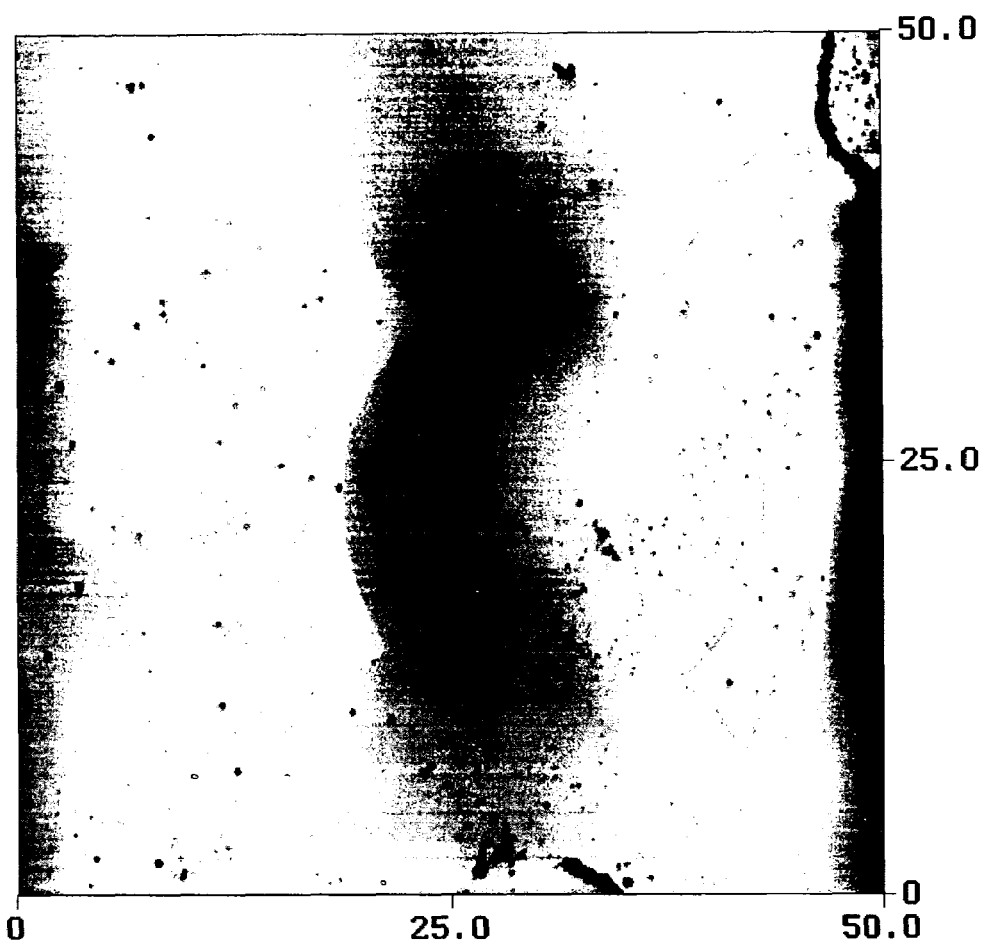
FIG. 6 is an atomic force microscope (AFM) image (50 microns×50 microns) of a CMP-finished GaN that had surface morphology similar to the wafer whose surface is shown in FIG. 4. The GaN material was grown with conditions that favor pit formation (pitted process) and growth pits were removed during polish. The distribution of the etch pits and dislocation density was not uniform and was concentrated near the center of the recessed area.

FIG. 6 is an AFM image of a 50 micron×50 micron area of a CMP-finished GaN wafer having a surface similar to that shown in FIG. 4 hereof and grown by a pitted surface growth process. The distribution of the crystal defects was not uniform, and the center region of the recessed area had a higher density of dislocations. The overall dislocation density was about $1 \times 10^7$/$cm^2$ of GaN surface area, although many 10 micron×10 micron areas of the surface have dislocation density below $5 \times 10^6$/$cm^2$. This dislocation distribution was associated with HVPE growth conditions yielding a pitted surface morphology.

Figure 7:
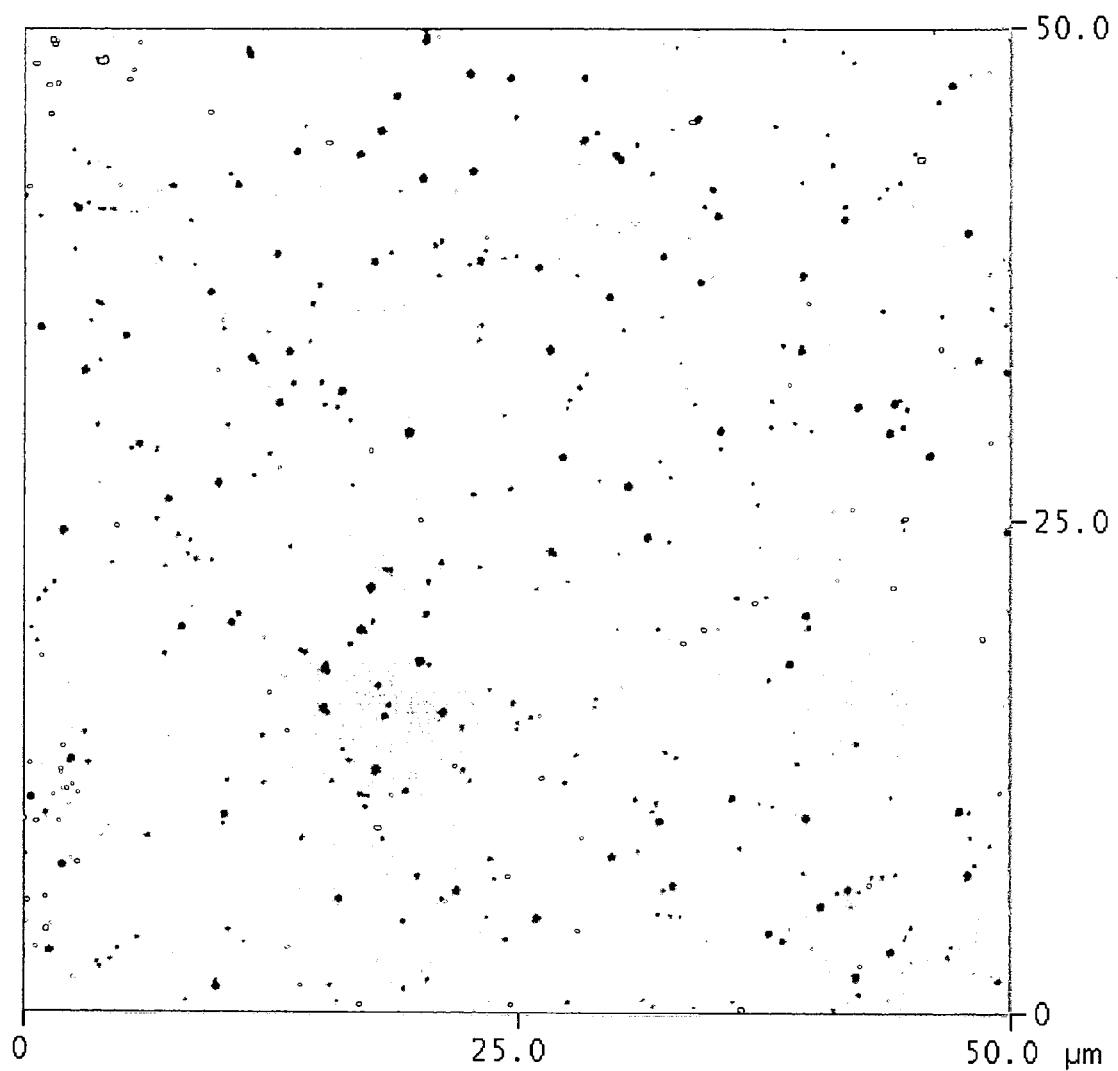
FIG. 7 is an atomic force microscope image (50 microns×50 microns) of a CMP-finished GaN that had surface morphology similar to the wafer whose surface is shown in FIG. 3. The GaN material was grown with a pit-free process. The distribution of the etch pits and dislocation density is uniform.

When GaN growth conditions were employed that yielded pit-free textured surfaces like the surface shown in FIG. 1, the distribution of dislocations was quite different. FIG. 7 is an AFM image of a 50 micron×50 micron area of a CMP-finished GaN material with surface morphology similar to that of the GaN surface shown in FIG. 3, and grown using a pit-free process. The distribution of the etch pits and dislocation density of the GaN surface was uniform, with an average dislocation density of the GaN surface on the order of about $1 \times 10^7$ dislocations/$cm^2$.

Although the average dislocation density of GaN films produced by conditions that yield pitted surface morphology (i.e., films grown by a pit-forming growth process) and the average dislocation density of GaN films produced by conditions that yielded pit-free textured surface was approximately the same, the distribution of the dislocations was different in the two processes. Specifically, the pit-forming growth process yielded films with randomly distributed low dislocation areas and high dislocation areas. The origin of this low dislocation density area morphology in the pit-forming growth process related to the fact that under pitted growth conditions, surface pits were formed during the growth of the GaN material. These pits were typically faceted pits in the shape of inverse hexagonal pyramids and occasionally inverse dodecagonal pyramids. The facets of the pits comprised typical <11-22> and <1-101> family planes.

During the growth on the pitted surface of the GaN under pitted growth conditions, there are at least two microscopic growth directions: (1) the aforementioned growth direction along the c-axis (which is an average growth direction), and (2) along the facets of the pits. Due to the crystal orientation differences of these respective c-axis and facet direction growth surfaces, the growth rate on the c-plane (c-axis growth) and on the facets of the pits can differ from one another and can change differently in relation to one another with changes in the growth conditions.

Under conditions that promote higher growth rates in the c-axis direction than in the facet direction of the pits, the pits will grow larger and eventually cover the growth surface. When the growth conditions that have higher growth rate on the facets of the pits than on the c-plane are imposed, pits will be filled.

In order to maintain the pitted growth surface morphology during the growth, the growth rate on the c-plane should be similar to or slightly greater than the growth rate on facets of the pits. Threading dislocations typically follow the growth direction, and thus the direction of the threading dislocations in the GaN film grown with pitted surface morphology will not be parallel to the c-axis, but rather, will have a tilt angle with respect to the average growth direction.

When growing GaN for a longer period of time under pitted growth conditions, the dislocations will gradually be concentrated near the center of pits and at the edges of the pits. The clustering helps to bring dislocations together and dislocations with opposite Burger's vectors that meet annihilate. However, incomplete annihilation takes place because not all the dislocations meet other dislocations. Furthermore, we have observed that dislocations concentrated near the center of the pits can sometimes disperse outwardly as the pits grow larger.

FIG. 8 is a DIC optical image of a GaN surface after CMP and etching with hot phosphoric acid. The optical image shows the concentration of dislocations on the growth surface of the GaN material. The GaN material was grown under pitted growth morphology to a thickness of about 5 mm. After CMP and hot phosphoric acid etching, the dislocations were decorated as etching pits and observed with the DIC microscope. The distribution of the pits was not uniform. Some areas had extremely low dislocation density (<1E5 $cm^{-2}$), while other areas had moderately high dislocation density (~1E7 $cm^{-2}$). The dislocations concentrated in the areas that constituted the center and certain edges of the pits during the growth process. Under pitting growth conditions, the dislocations did not continue to annihilate substantially, even when the GaN material was grown to a thickness of 5 mm.

In accordance with the present invention, gallium nitride material is grown to produce a large area, uniformly low dislocation density gallium nitride material, e.g., in the form of a substrate article, such as a boule or single wafer body, by first concentrating the dislocations and then annihilating them in respective phases of the growth process. During the pitted growth phase, in which the GaN material is grown to form and develop pits in the growth surface, at least two microscopic growth directions exist, one along the c-axis and the other along the facets of the pits. The growth rates on the c-plane should be similar to or slightly greater than the growth rate on facets of the pits in a stable pitted growth phase, and such growth processes concentrate the dislocations near the centers and bottom portions of the pits on the growth surface.

After the dislocations are substantially concentrated near the bottom regions of the pits, the growth condition is changed in such manner that the growth rate on the facets of the pits is greater than the growth rate on the c-plane. During this second stage of the growth process, the pits will grow smaller because of the higher growth rate on the facets of the pits. The threading dislocations in following the growth direction are thereby concentrated and annihilate with reduction of the pit size of the pits across the growth surface, i.e., the facets of the pits will eventually grow to meet in a single point due to faster growth rate on the facets than on the c-plane, so that the concentrated dislocations meeting one another either annihilate each other or merge into a single dislocation.

FIGS. 9A-9E are a series of schematic illustrations showing the growth of a GaN substrate article according to one embodiment of the present invention, including provision of a substrate (FIG. 9A). Growth of GaN on such substrate is carried out under pitted growth conditions producing small pits in the GaN film on the substrate surface, with lines perpendicular to growth surface representing threading dislocations (FIG. 9B). Note that the angle of the dislocations is exaggerated to illustrate the phenomenon. The pit-forming growth is continued so that the pits in the GaN material grow larger and concentrate the dislocations in the material (FIG. 9C). Growth of the GaN material then is shifted to pit-filling growth conditions. Under these conditions, the pits grow smaller, partially annihilating the dislocations, until pits are completely filled and all dislocations meet at the moment of pit closure, leaving a few dislocations remaining (FIG. 9D). The pit-filling growth step preferably is carried out until an essentially pit-free surface is produced. The growth of the GaN material then is continued to form the GaN material to a desired thickness, with the growth surface being constituted by substantially dislocation-free GaN in such further growth, to produce a large area, uniformly low dislocation density product GaN material (FIG. 9E).

Figure 10A:
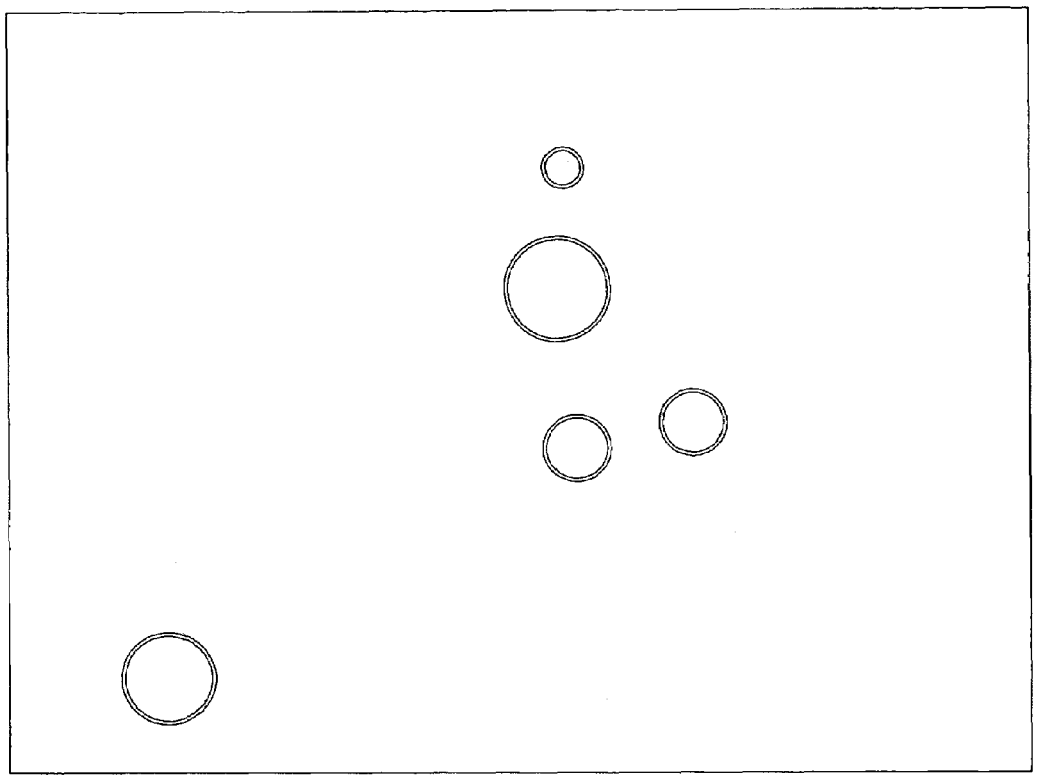
FIGS. 10A-10B are DIC optical microscope images (FIG. 10A, focusing on the wafer surface.
Figure 10B:
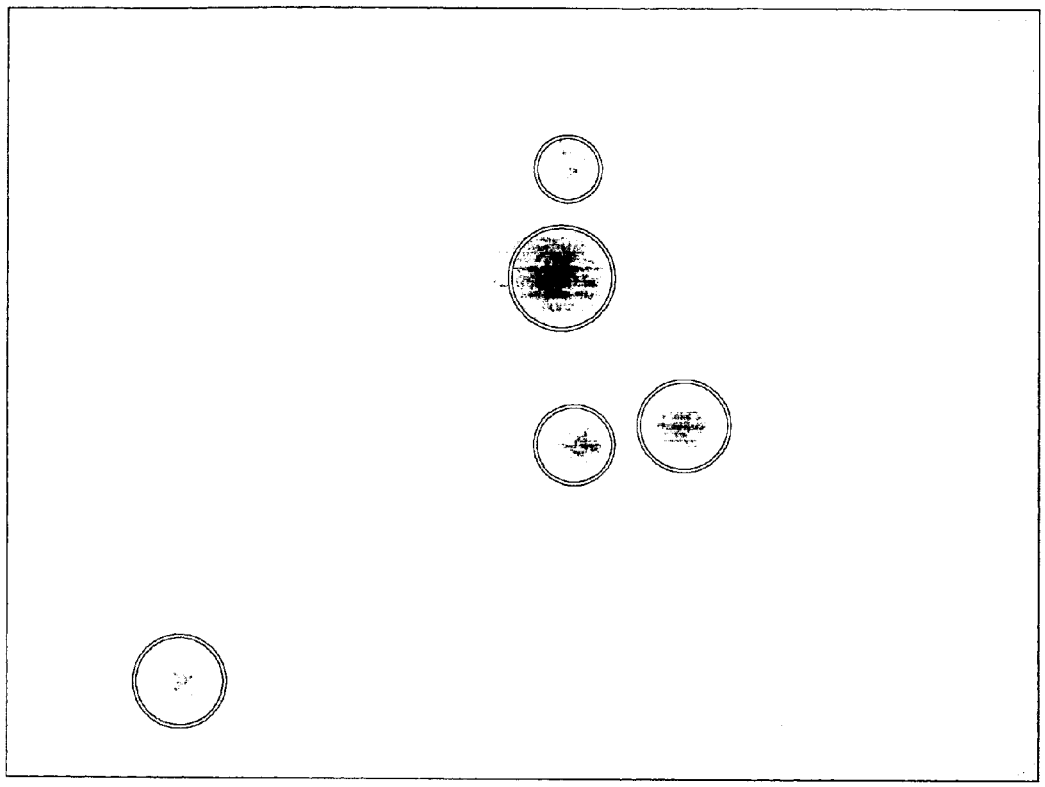

FIGS. 10A-10B show differential interference contrast (DIC) optical microscope images (FIG. 10A, top view of wafer obtained by focusing on the surface; FIG. 10B, image underneath the surface of the same area as the FIG. 10A view, by adjusting the focus of the microscope to the undersurface) of the defect distribution of a GaN wafer grown according to one embodiment of the present invention.

The dislocations were decorated as etch pits by chemical mechanical polishing and hot phosphoric acid etching. Due to the subtle difference between material grown along c-axis and the material grown along the facets of the pits, a corresponding contrast between the two materials (c-axis material, and facet direction material) was observed under DIC. This allowed identification of the area under which growth along the facets of the pits (pit-filling) occurred, as circled in FIG. 10. In one area, the dislocations were completely eliminated after the pit-filling, resulting in perfect crystalline character. In other areas, only one dislocation remained after pit closure. The dislocation density for the wafer was about 1E6 cm$^{-2}$ and the defects were uniformly distributed.

The initial substrate for the growth of uniformly low dislocation density gallium nitride in accordance with the present invention may be of any suitable type, including, for example, gallium nitride, sapphire, silicon carbide, gallium arsenide, silicon, lithium gallate, lithium aluminate, lithium aluminum gallate, zinc oxide, diamond, spinel, magnesium oxide, etc. It will be appreciated that different substrates may require different substrate pretreatments prior to growth of gallium nitride in order to achieve high crystalline quality, as is readily determinable within the skill of the art based on the disclosure herein.

While the growth of the uniformly low dislocation density GaN wafer has been described hereinabove with reference to an illustrative HVPE growth process, any other suitable vapor phase growth methods can be employed, such as metal-organic vapor phase epitaxy (MOVPE), metal-organic chloride method (MOC), molecular beam epitaxy (MBE), sublimation, sputtering, reactive sputtering, reactive sublimation, etc.

In addition, any combination of one or more techniques either together or in sequence may be considered a suitable growth technique.

The differences between various vapor phase growth methods in this respect resides in the manner of delivery of the growth species to the growth surface for forming the GaN material, and the types of the growth species that are employed. In MOVPE, for example, a volatile organometallic compound of gallium such as trimethyl gallium (TMG) or triethyl gallium (TEG) is reacted with ammonia to form gallium nitride. In sublimation, polycrystalline gallium nitride solid is sublimed to form a gallium nitride film on a substrate in a suitable ambient sublimation environment. In sputtering and reactive sputtering, a target of gallium nitride or gallium is bombarded with ions in a suitable ambient environment, such as a nitrogen or ammonia ambient, to deposit GaN on the substrate. In reactive sublimation, gallium is sublimed in nitrogen or ammonia, to form gallium nitride on the substrate. The conditions for the pitted growth and for the pit-filling growth in a specific growth method can be readily determined within the skill of art based on the disclosure herein.

Considering the illustrative HVPE process, the growth temperature, the growth rate, and the NH$_3$:HCl ratio are controlled in the respective phases of the two-phase process to produce the desired large area, uniformly low dislocation density GaN material. At constant temperature (1030° C., for example) and constant HCl flow (to produce constant growth rate, e.g., a growth rate of 150 μm/hr), increasing the NH$_3$ flow will change the GaN growth process from an optimal pit-filling growth condition that produces pit-free textured surface, to a pitted growth condition that produces pitted surface morphology. At constant HCl and NH$_3$ flow (producing a constant growth rate at a constant NH$_3$/HCl ratio), reducing the growth temperature will change the growth condition from an optimal pit-filling growth condition to a pitted growth condition.

The reactor geometry of the specific GaN growth reactor that is employed for growing the GaN material of the invention will affect the flows and local growth environments of the growth process. It therefore is important to systematically investigate the growth morphology as a function of the growth parameters, in order to identify the pitted growth conditions and the pit-filling growth conditions for a specific reactor employed in a given application of the present invention. Such determination is readily made within the skill of the art, as hereinabove described, utilizing optical micrographs, SEM and AFM techniques to characterize the surface in the pit-forming and pit-filling phases of the GaN growth process, to identify specific process conditions appropriate for forming the large area, uniformly low dislocation density GaN material.

After identifying suitable pitted growth conditions and pit-filling growth conditions, the respective growth conditions are carried out sequentially to produce uniformly low dislocation density gallium nitride as a large area, single-crystal material. The pitted growth step, i.e., the growth of GaN under conditions serving to form pits and to concentrate dislocations at the bottoms of the pits in the material, is critical to the reduction of the overall dislocation density. Prior to the pit-filling step, the growth process is carried out so that the growth surface is covered with pits, so that the dislocations are swept to the bottoms of the pits and can be annihilated in the second growth step (pit-filling step).

In this respect, it is preferable to conduct the first step of pitted growth so that greater than 50% of the growth surface is covered with pits, more preferably to have greater than 75% of the surface area covered with pits, and even more preferably to have greater than 90% of the growth surface covered with pits, prior to the second step of pit-filling growth.

The reason for the preference for high coverage of the pits on the growth surface is that growth along the c-axis (i.e., the area not covered with the pits) involves dislocations growing along the same direction, so that the dislocations have substantially reduced chance for annihilation and the final product correspondingly has higher dislocation density.

The pitted growth process, by contrast, functions to concentrate the dislocations. When the growth surface is substantially covered with the pits, the pit density is inversely proportional to the square of the pit size. The final dislocation density after the second pit-filling step depends on the density of pits, since not all dislocations in the pits will necessarily be annihilated.

Accordingly, growth of GaN to form pits over a major extent (e.g., >90%) of the GaN growth surface in the pitted growth phase, and continuing such growth under conditions favoring preferential growth in the facet direction of the pits, to form larger-sized pits at the end of the pitted growth phase, prior to conducting the second phase of pit-filling growth, permits the achievement of large area, uniformly low dislocation density GaN.

The average pit size of pits on the GaN surface prior to the pit-filling step preferably is greater than 25 μm, more preferably greater than 50 μm, and most preferably greater than 100 μm. Such pit size is the maximum diameter or transverse dimension of the pit measured at the growth surface, in the plane of such surface. The upper limit of pit size may be imposed by crystallographic factors, which at larger pit sizes increase the likelihood that polycrystalline formation within the pit will degrade rather than improve the crystalline character of the growing GaN material.

The position of the pits on the GaN surface can be randomly distributed, produced stochastically by the pitted growth process under the corresponding pitted growth conditions. Alternatively, the position of the pits can be predetermined, by appropriate processing of the starting substrate.

Since the concentration of the dislocations inside the pits is due to the facet growth direction in the pits, the nature of the facets is more important than the pits themselves. Instead of patterning the starting substrate to produce predetermined pits, the starting substrate can alternatively be patterned to produce faceted growth morphology.

In the first step, a pitted (faceted) growth condition is used to produce facets. The growth rate along the c-axis is faster than the growth rate on the facets, producing a surface covered with facets. The dislocations are swept to the valley regions between the facets, but are not substantially annihilated. In the second step of pit-filling, the growth rate on the facets is faster than the growth rate on the c-axis, so that the valleys between the facets are filled up, leading to the formation of a smooth c-axis growth material. At the moment of closure of the valleys, the dislocations are confined and they either annihilate each other or merge into fewer dislocations. The first pitted growth phase and the second pit-filling phase may each be carried out in one or more steps, and the vapor phase growth process may be carried out with other process steps, other than first and second phase steps, e.g., intermediate process steps may be carried out between the first phase and second phase steps, as may be desired in a given application of the method of the invention.

The thickness of the pitted or faceted growth layer should be thick enough to permit substantial concentration of the dislocations near the bottom of the pits or near valleys between the facets. The thicker the pitted layer, the higher the surface coverage with dislocation-concentrating pits, thus the better the final product gallium nitride material. The pitted growth layer is preferably grown to a thickness greater than 50 µm, more preferably a thickness greater than 100 µm, and even more preferably a thickness greater than 200 µm.

After growth of the pitted layer, the growth condition is changed to a pit-filling condition, in which the growth rate on the facets is faster than the growth rate on the c-plane. The pit-filling conditions typically involve higher growth temperature and/or lower $NH_3$ flow (i.e., lower $NH_3$/HCl ratio) than the pitted growth condition. After the pits are completely filled, the dislocations in the pits are substantially annihilated, resulting in uniformly low dislocation density GaN. The duration of the pit-filling growth should at a minimum allow the filling and closure of a majority of the pits, or otherwise achieve a desired low pit density, as appropriate to produce uniformly low dislocation density GaN. The duration of the pit-filling growth process necessary for fill of the pits is readily determinable by optical, SEM and AFM techniques as described herein. Preferably the pit-filling growth step is conducted until the pit density has been reduced to a level not exceeding 10 pits/cm$^2$ of the growth surface. More preferably, the pit-filling step is continued to form an essentially pit-free surface, e.g., having a pit density of 1 pit/cm$^2$ or less. Most preferably, the growth process is conducted in such manner as to produce a III-V nitride single crystal material having a totally pit-free surface.

Prior to the completion of pit-filling, two microscopic growth directions exist, namely, the growth on the c-plane, and the growth on the facets of the pits. After the pits are completely filled, only the c-plane growth direction exists. Considering the steps required to form a GaN wafer, which include lapping, polishing and chemical-mechanical polishing of the front (growth surface) as well as mechanical grinding or lapping of the back side (substrate side), the thickness of the final c-plane growth should be such as to allow the material at the front surface after the GaN wafer forming steps to remain a uniformly c-plane growth material. For such reason, in one embodiment of the invention, the thickness of the complete c-plane growth after the pits are completely filled is advantageously at least 50 µm. More preferably, the thickness of the GaN material is greater than 200 µm, and most preferably such thickness is greater than 400 µm.

The thickness of the c-plane growth may in part be determined such that wafer fabrication yields an upper surface that is all c-plane. If the c-plane growth is not carried out for a long enough period of time after pit closure, the surface of the finished wafer may contain recessed regions, similar to those shown in FIG. 4. If sufficient c-plane growth is carried out, a smooth, recess-free surface is produced, as shown in FIG. 3.

Additional thickness may be required to reduce impurity concentration, reduce dislocation density or to enable angle lapping for off-cut wafers with the same crystalline orientation. Longer growth (>2 mm) at the pit-filling conditions to produce a GaN ingot is advantageous, since under longer growth condition, the dislocations may further annihilate and the long ingot then can be sliced into multiple wafers of large area, uniformly low dislocation density and high quality, for subsequent device fabrication thereon to produce microelectronic and opto-electronic products. Alternately, multiple cycles of pit-forming and pit-filling steps can be employed to further reduce dislocation density. Concerning the angle of growth of the III-V nitride material in the pits, the general growth direction in the pits should be roughly c-axis growth but tilted.

In addition to forming large area, uniformly low dislocation density and high quality single crystal III-V nitride material, the process of the invention involving pitting growth serves to substantially reduce the susceptibility of the product III-V nitride material to cracking.

The transition from pitted growth conditions to pit-filling growth conditions can be abrupt, gradual or multi-stepped. Furthermore, each phase of the pitted growth and pit-filling growth can involve more than one set of growth conditions. For example, in the pitted growth phase, it may be advantageous to have a condition that produces high density of smaller pits at the beginning of the growth, followed by a condition to grow, coalesce and/or partly fill small pits to form larger pits at the end of the pitted growth phase. In the pit-filling phase, it may be advantageous to have a condition that fills the pits completely, followed by a condition that produces growth on the c-plane surface at a higher rate. Furthermore, the transition between different growth conditions may be gradual or ramped, so that the phases of pitted growth and pit-filling growth become less sharply demarcated from one another. It will also be appreciated that the growth process of the invention may be carried out in multiple cycles of alternating pit growth and pit-filling growth steps (e.g., a first step of pit growth, followed by a second step of pit-filling growth, followed by a third step of pit growth, followed by a fourth step of pit-filling growth, optionally with additional pit growth and pit-filling growth steps in sequence).

When the growth process including pitted growth and pit-filling growth is slightly deviated from the optimal condition, a few large pits may still remain after pit-filling growth. Preferably, the density of such growth pits is less than 1 cm$^{-2}$. Excluding such growth pits, the GaN material has uniformly low dislocation density.

When the growth surface has pits, mechanical lap, polish and CMP can remove the pits to produce a pit-free surface. However, in this case, the surface after CMP contains a recessed area of the type shown in FIG. 4. Even if the growth surface has no pits, after wafer processing involving lap, polish and CMP, the surface may still contain a recessed area of the type shown in FIG. 4. The recessed area typically has higher concentration of impurities such as oxygen or silicon. The distribution of the dislocations in the recessed area typically is not uniform. Excluding the recessed area, the surface has uniformly low dislocation density. Preferably, the recessed area is less than 10% of the overall wafer surface area.

It is known in the art that the impurities in a semiconductor material affect the electric properties of the material. For example, it is well-established that silicon and oxygen act as shallow donors in GaN to produce n-type conductivity. Oxygen often is un-intentionally incorporated in GaN during HVPE growth because of gas source impurities and reactor leaks. Magnesium also may be introduced to the GaN material as an impurity species that acts as an acceptor in GaN, and with proper activation, produces p-type conductivity GaN material. Additionally, transition metals may be introduced to the GaN material to function as deep level acceptors to produce semi-insulating GaN, by compensating residual donor species in the GaN material.

Although un-intentionally doped HVPE GaN typically is n-type due to oxygen or silicon impurities, n-type conduction can be increased and controlled by intentionally introducing a silicon impurity from a silicon source such as silane or by introducing an oxygen-containing inpurity such as dioxygen in the gas stream that is fed to the GaN growth reactor. When impurities are present in the gas phase in the growth reactor, the growth conditions that produce pitted growth morphology and pit-filling may be slightly different from those that are employed in the absence of such impurities being introduced, and as a result of the presence of such impurities, it may be necessary to correspondingly adjust the process conditions to most advantageously carry out doping in the pitted growth and pit filling phases of the two-stage process. Additionally, the amount of impurities in the growth ambient and incorporation may be different during each stage of the process. Impurities when used can be introduced in the pitted growth step, or in the pit-filling step, or in both the pitted growth and the pit-filling steps.

The growth of GaN on a substrate by the successive steps of pitted growth and pit-filling growth, in accordance with the invention, produces a GaN wafer product. Two main types of wafer-forming processes can be utilized—ingot processes and single wafer processes.

When the grown GaN material is thick, e.g., forming an ingot with a length greater than about 2 mm, a multi-wafer process is advantageously employed. The ingot is oriented, ground to a pre-determined size, e.g., ≧2 inches in diameter, and sliced into multiple wafers. The ingot, as a bulk GaN material article which functions as a source body for production of multiple wafers, typically has a thickness of at least 1 mm, more preferably at least 5 mm, and most preferably at least 10 mm. After the multiple wafers are sliced from the ingot, the back and front main surfaces of the wafer are processed. The back side of the GaN wafer is lapped and/or polished, and the front side of the GaN wafer is lapped, polished and CMP-finished, to produce a GaN wafer ready for homoepitaxial growth. The wafers may have any suitable thickness. For example, wafers may be formed having thicknesses in excess of 50 μm, 200 μm, or 500 μm, as necessary or desired for a specific application. Ingots may also be formed with homogeneous pit growth and pit-filling growth steps to produce bulk III-V nitride articles that are amenable to producing wafers of alternative orientations, e.g., a-plane wafers, m-plane wafers, etc., as sliced from the boule and finished into polished wafers.

When the grown GaN is not an ingot, a single-wafer process is advantageously used to form the GaN wafer. Typically, for a single-wafer process, the substrate for the GaN growth is not gallium nitride, and the foreign substrate (template) is removed prior to formation of the GaN wafer. The template removal can be carried out by any suitable means or method. For example, the template removal may involve elimination of the template, removal of part or all of the template, or removal of all of the template and part of the GaN adjacent to the template. Specific techniques that may usefully be employed for such purpose include mechanical grinding, chemical etching, interfacial decomposition, interfacial fracturing, or any other means or method appropriate to the particular template.

In a preferred embodiment, the heteroepitaxial substrate is removed in situ from the grown GaN material at a temperature in the vicinity of the growth temperature at the conclusion of the growth process, to yield a separated GaN substrate article of freestanding character. Such in situ removal produces a freestanding GaN wafer substrate having no thermal coefficient of expansion (TCE) defects therein, such as otherwise are produced when the heteroepitaxial structure including the grown GaN material and the foreign substrate are cooled to ambient (e.g., room) temperature. As an example, an in situ etching away of the foreign substrate at the growth temperature, or at a temperature in the vicinity of the growth temperature, e.g., within 100° C. of the growth temperature, with a chemical etchant reagent effective for such purpose, is one approach for forming a high quality GaN substrate article in the single wafer process.

The grown GaN then is sized appropriately, to a predetermined size, ≧2 inches diameter, for example, by an appropriate technique, such as for example mechanical grinding, or sandblasting, or laser cutting. Subsequently, the back side of the grown GaN is lapped and/or polished, and the front side of the grown GaN is lapped, polished and CMP-finished to produce a GaN wafer ready for homoepitaxial growth. Since the front side of the grown GaN has higher quality than the back side of the grown GaN, the material removal from the front side is desirably minimized. Lapping and polishing of the front side is utilized mainly for the purpose of achieving a flat wafer conformation, and lapping of the backside is utilized primarily to achieve a desirable GaN wafer thickness. The front side of the GaN wafer has uniformly low dislocation density. The back side may have higher dislocation density than the front side, and the distribution of the dislocation density may be not uniform at the backside.

The chemical mechanical polish (CMP) can be carried out using any suitable CMP formulation and CMP process. The CMP rate is slightly higher in the recessed area where the material was grown in the direction along the facets of the pits on the growth surface and has higher impurity concentration. The CMP polished surface is smooth, with surface roughness (RMS) less than 1 nm as measured by AFM in the 10×10 μm area.

During the wafer process, the wafer can be processed in such way that the surface of the wafer is parallel to the c-plane of the GaN crystal. Alternatively, the surface of the wafer can be at a small angle (e.g., ≦10°) with respect the crystalline c-plane. Such surface is called a vicinal surface. Such vicinal GaN surface is advantageous for homoepitaxial growth.

GaN wafers produced by the methods disclosed herein are of high quality for device fabrication applications, of large area, and have a low density of dislocations, with the dislocations uniformly distributed across the large area wafer surface. The density of the dislocations on the wafer surface typically does not exceed about 1E6 cm$^{-2}$. The prior art has produced either low dislocation density but small area GaN (which is unable to be grown to larger size), or alternatively large area GaN having non-uniformly distributed defects across the wafer. As discussed herein in the Background section hereof, the prior art has been unable to achieve the combination of large area single crystal growth of GaN and the provision of a low dislocation density that is uniformly low across the large area of the GaN substrate.

Large area, uniformly low dislocation density III-V nitride material produced in accordance with the present invention is formed with at least one surface having uniformly low dislocation density. In specific embodiments, the III-V nitride material may be grown so that both main surfaces of the material have uniformly low dislocation density, or the III-V nitride material may be grown so that one of such main surfaces of the material has uniformly low dislocation density while the other main surface may have high and/or non-uniform distribution of the dislocations, with dislocation density progressively decreasing from the latter (e.g., bottom) surface to the former (e.g., top) surface.

Regardless of its specific morphological variety, the III-V nitride material of the invention has at least one large area surface with uniformly low dislocation density.

Large area, uniformly low dislocation density GaN wafers produced in accordance with the present invention can be utilized as a substrate for fabrication of a wide variety of electronic and opto-electronic devices and integrated circuitry products. The invention therefore contemplates electronic device structures including the large area, uniformly low dislocation density GaN wafer, on which is fabricated a device, such as for example a laser diode, a light-emitting diode, or a high electron mobility transistor, as well as integrated circuitry including such GaN wafers, and GaN wafers of such type having at least one epitaxial layer thereon, which may be homoepitaxial or heteroepitaxial in character, depending on the specific application and end use of the GaN wafer-based product.

The present invention represents a significant improvement over the prior art, in providing high-performance gallium nitride substrates suitable for fabrication of microelectronic and opto-electronic devices.

While the invention has been described herein in primary reference to gallium nitride, it will be recognized that the invention is not thus limited, but rather the aspects and advantages of the invention include application of the generalized methodology hereof to the formation of large area, uniformly low dislocation density III-V nitride materials other than GaN, such as for example, AlN, InN, AlInN, GaAlN, GaInN, GaAlInN, etc.

The features and advantages of the present invention are more fully shown with respect to the following non-limiting examples.

EXAMPLE 1

Single Wafer Process

In this example, two-step GaN HVPE growth on a sapphire substrate was carried out. In the first stage of the growth, the growth temperature was 1010° C., the NH$_3$/HCl ratio was 17, the growth rate was about 160 μm/hr, and the thickness of the grown film was about 320 μm.

After the completion of the first step, the growth temperature was raised to 1030° C., and the NH$_3$/HCl ratio was reduced to 8.6, and growth was continued until the thickness of the second stage GaN material was about 640 μm.

After the completion of the growth, the sapphire substrate was removed from the thick GaN film. The GaN wafer blank was first ground about its edge by mechanical means. The GaN wafer had two surfaces. The surface constituting the growth surface was gallium-terminated. The side that was attached to the sapphire substrate was the nitrogen-terminated side. The gallium-side of the wafer was first lapped with coarse diamond slurry on a lap machine, and then polished with a fine diamond slurry on a polish pad. The front (gallium-side) was finished with a chemical mechanical polish process using a mixture of colloidal silica and diluted hydrochloric acid. The back side was lapped and polished.

Figure 11:
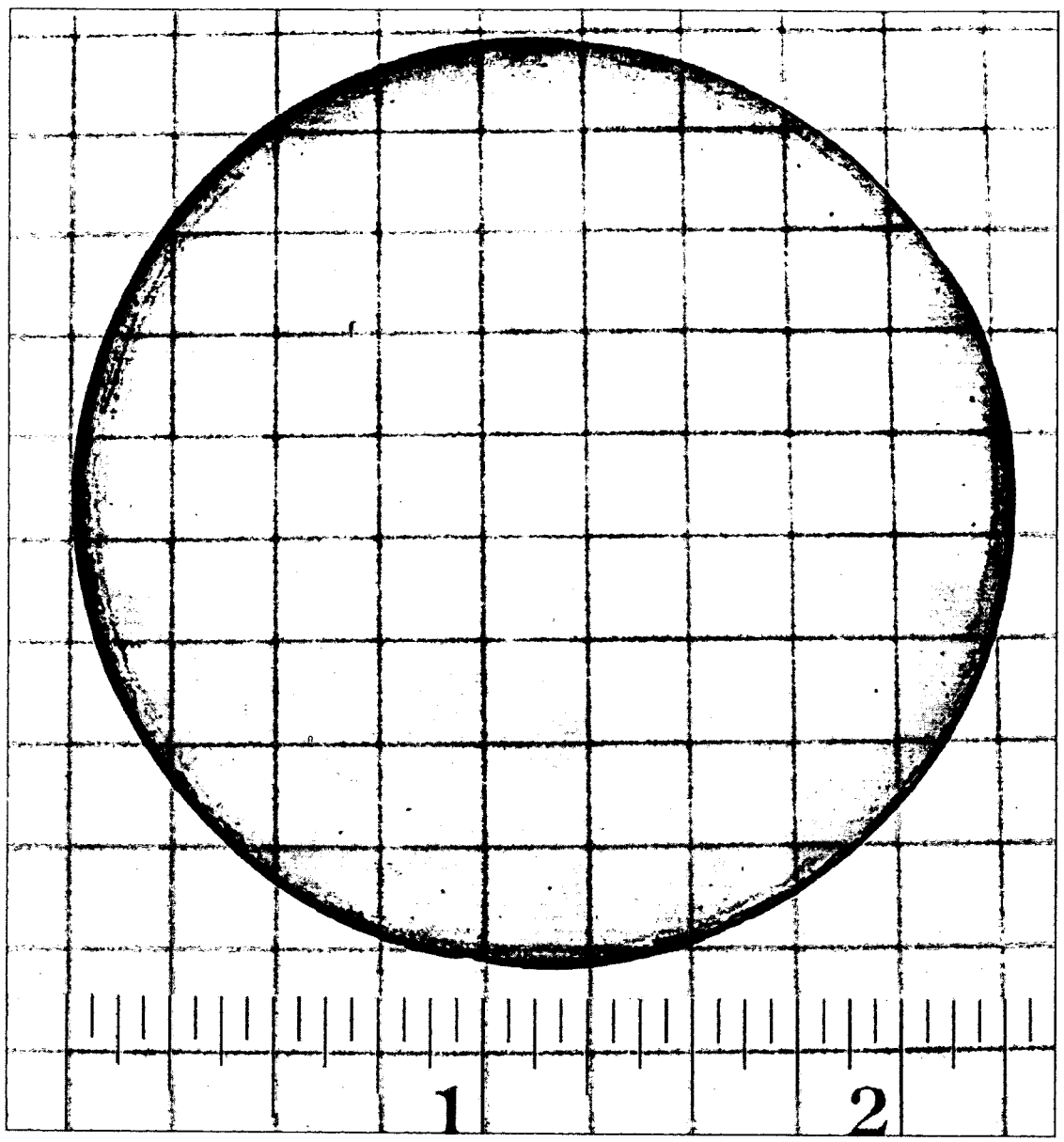
FIG. 11 is a photograph of a 2.3 inch diameter double side polished gallium nitride wafer produced according to one embodiment of the present invention.

FIG. 11 is a photograph of the two-sided polished gallium nitride wafer produced by the foregoing process. The diameter of the wafer was 2.3 inches.

A piece of the wafer from the uniformly grown area of the gallium-terminated surface was polished by a CMP process and etched in hot phosphoric acid to determine its dislocation density. The CMP process and hot phosphoric acid etching decorated the dislocations as etch pits.

Figure 12:
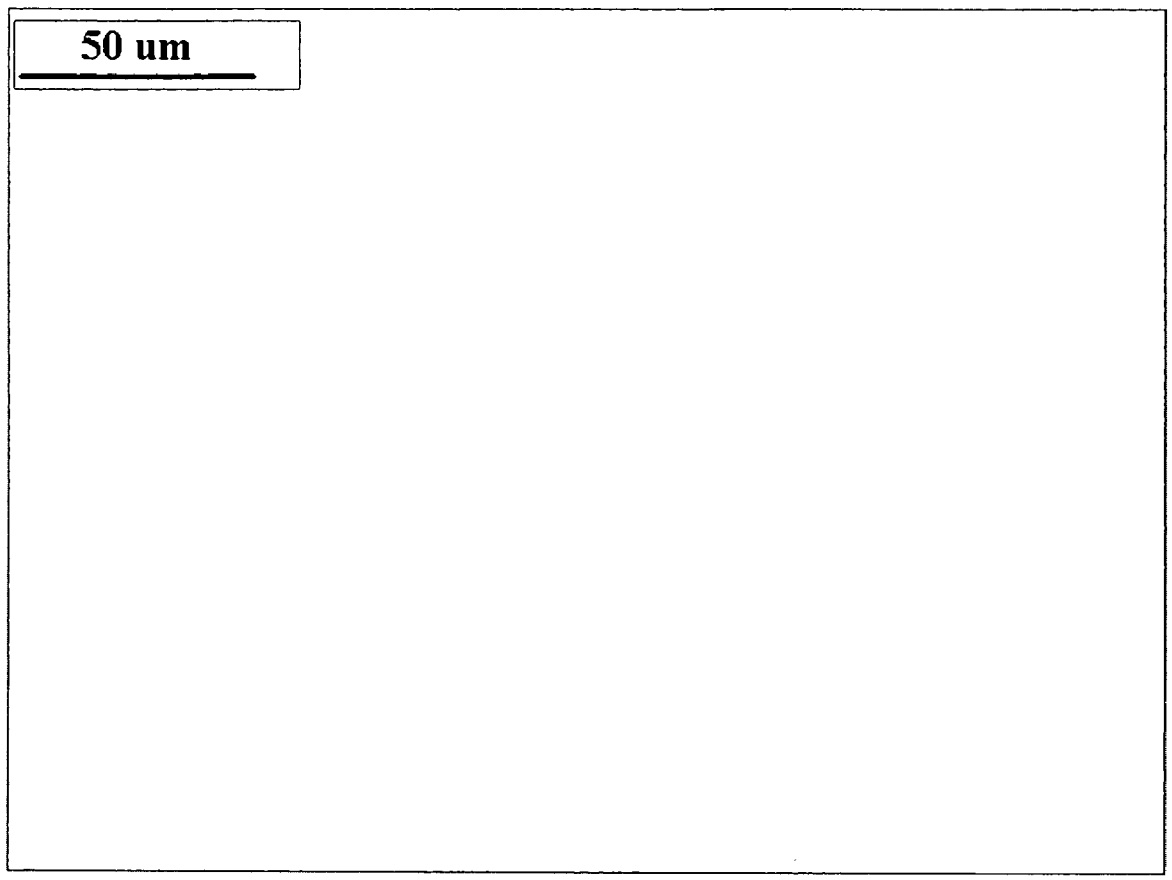
FIG. 12 is a differential interference contrast optical microscope image of the dislocations on a GaN wafer according to one embodiment of the present invention. Dislocations were decorated by chemical mechanical polishing and hot phosphoric acid etching.

FIG. 12 shows a differential interference contrast (DIC) microscope image of the resultantly etched surface. As shown, the etch pits were visible under the microscope. The etch pit density for the sample was 5.5E5 cm$^{-2}$.

Figure 13:
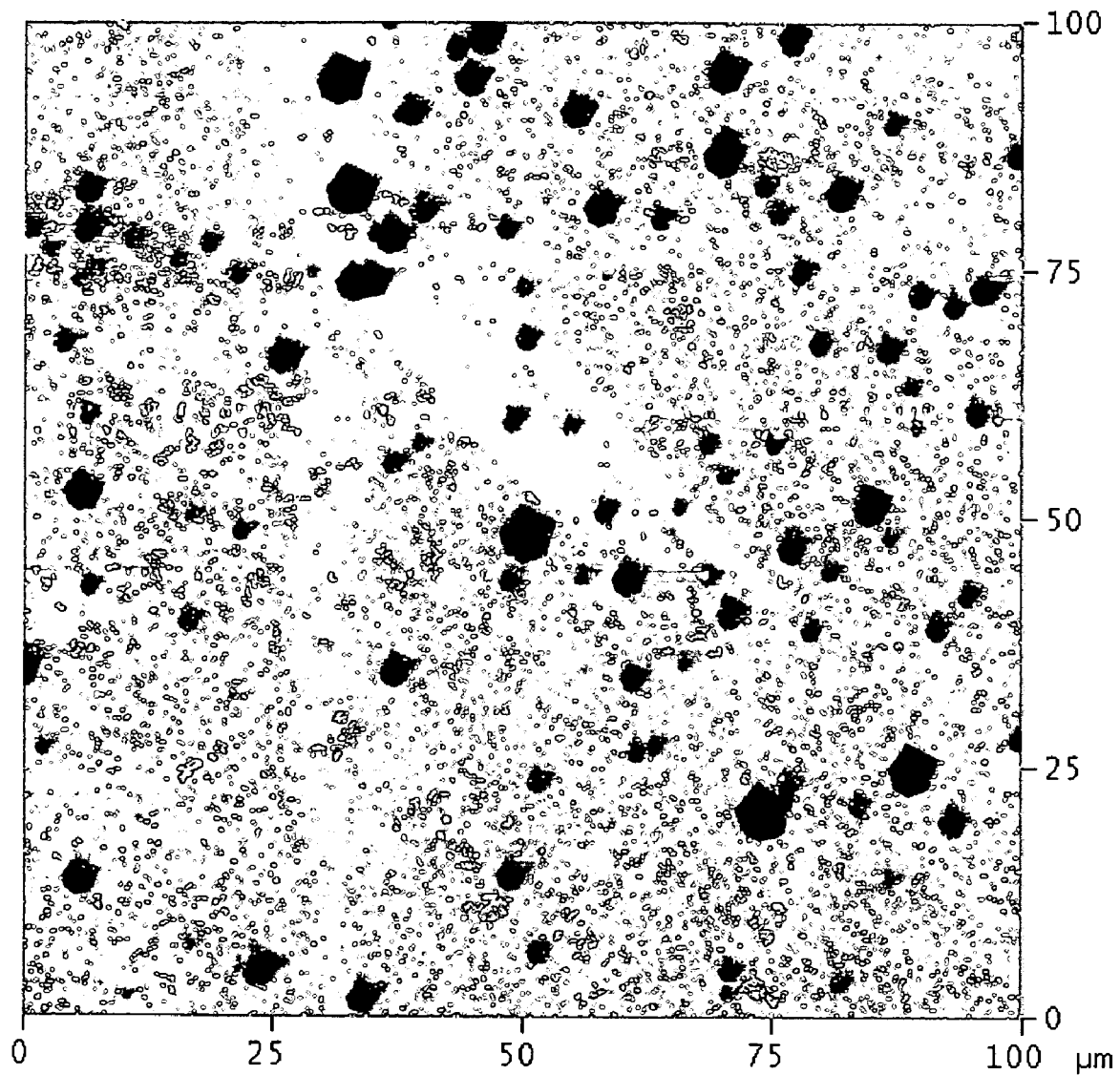
FIG. 13 is a 100×100 µm AFM scan of a GaN wafer according to one embodiment of the present invention. Dislocations were decorated by chemical mechanical polishing and hot phosphoric acid etching.

FIG. 13 shows a 100×100 μm$^2$ AFM scan of the hot phosphoric acid-etched GaN wafer surface. The etch pit density for the image was 8.5E5 cm$^{-2}$, in good agreement with the etch pit density counted using the DIC optical microscope. Examination of the entire etched wafer under the microscope showed that the etch pits were uniformly distributed across the wafer surface. This example illustrates the growth of uniformly low dislocation density, large area gallium nitride wafer, produced by the method of the present invention.

EXAMPLE 2

GaN Ingot Process

In this example, the two-step HVPE GaN growth process was carried out to grow a relatively long GaN ingot.

In the first stage of the growth process, the growth temperature was 1010° C., the NH$_3$/HCl ratio was 17, the growth rate was about 160 μm/hr, and the thickness of the grown film was about 320 μm.

After completion of the first step, the growth temperature was raised to 1030° C., and the NH$_3$/HCl ratio was reduced to 12.9. Growth of the GaN material was continued until the length of the ingot was 3.2 mm.

The ingot after its formation was processed into multiple wafers by slicing and subsequent lap, polish and chemical mechanical polish steps as in Example 1. Similar two-step HVPE GaN growth processes were carried out to grow GaN ingots having lengths on the order of 10 mm.

While the invention has been disclosed herein with reference to specific aspects, features and embodiments, it will be appreciated that the invention is not thus limited, but rather extends to and encompasses other variations, modifications and alternative embodiments, as will suggest themselves to those of ordinary skill in the art based on the disclosure herein.

Accordingly, the invention is intended to be broadly construed, to encompass all such variations, modifications and alternative embodiments, as being within the spirit and scope of the invention as hereafter claimed.

What is claimed is:

1. Uncut single crystal III-V nitride material having a large area of at least 15 cm$^2$ on a face thereof and having a uniformly low dislocation density not exceeding 3×10$^6$ dislocations per cm$^2$ of growth surface area on the face.

2. Material according to claim 1, selected from the group consisting of AlN, InN, GaN, AlInN, AlInGaN, InGaN, and AlGaN.

3. Material according to claim 1, wherein the III-V nitride material comprises GaN.

4. Material according to claim 3, doped with a dopant species.

5. Material according to claim 4, wherein the dopant species includes a dopant selected from the group consisting of oxygen and silicon.

6. Material according to claim 3, having a large area of at least 2 inches in nominal diameter.

7. Material according to claim 3, having a thickness of at least 0.1 mm.

8. Material according to claim 3, having an ADD not exceeding 2×10$^6$ cm$^{-2}$.

9. Material according to claim 3, having an ADD not exceeding 1×10$^6$ cm$^{-2}$.

10. Material according to claim 3, having an ADD not exceeding 5×10$^5$ cm$^{-2}$.

11. Material according to claim 3, having a DDSDR of less than 50%.

12. Material according to claim 3, having a DDSDR of less than 25%.

13. Material according to claim 1, doped with a dopant species.

14. Material according to claim 13, of a p-doped, n-doped or semi-insulatively doped character.

15. An article, comprising material as claimed in claim 1.

16. The article of claim 15, wherein said material is on a heteroepitaxial substrate.

17. The article of claim 16, wherein the heteroepitaxial substrate comprises a material selected from the group consisting of sapphire, silicon carbide, gallium arsenide, silicon, lithium gallate, lithium aluminate, lithium aluminum gallate, zinc oxide, diamond, spinel, and magnesium oxide.

18. The article of claim 15, wherein said material is GaN.

19. The article of claim 18, in the form of a crystal having a thickness of at least 50 μm.

20. The article of claim 19, wherein the thickness of the crystal is greater than 500 μm.

21. The article of claim 19, wherein the thickness of the crystal is greater than 2 mm.

22. The article of claim 19, wherein the thickness of the crystal is greater than 10 mm.

23. The article of claim 19, having a surface, including said large area, wherein said surface is at least 2 inches in nominal diameter.

24. Large area, uniformly low dislocation density single crystal gallium nitride, having a nominal diameter of greater than 2 inches, a thickness of at least 0.1 mm, an ADD not exceeding 1×10$^6$ cm$^2$, and a DDSDR of less than 25%.

25. Single crystal III-V nitride material grown exclusively in a bulk growth direction along the c-axis, having a nominal diameter of at least 2 inches, and having uniformly low dislocation density not exceeding 3×10$^6$ dislocations per cm$^2$ of growth surface area.

26. A wafer comprising the material of claim 25, the wafer having a nominal diameter of from 2 to 8 inches.

27. A wafer comprising the material of claim 25, the wafer having a rectangular or square shape, with each side at least 15 mm in size.

28. A wafer comprising the material of claim 25, the wafer having a surface that is parallel to the c-plane of the crystal plane of the single crystal III-V nitride material.

29. A wafer comprising the material of claim 25, the wafer having a surface disposed at an angle relative to the c-plane of the single crystal III-V nitride material.

30. The wafer of claim 29, wherein said angle is in a range of from about 0.1 to about 10 degrees.

31. A wafer comprising the material of claim 25, the wafer having surfaces thereof polished to a mirror finish.

32. A wafer comprising the material of claim 25, the wafer including a chemical mechanically polished gallium-terminated surface.

33. A wafer comprising the material of claim 25, wherein the wafer includes a c-plane surface.

34. A wafer comprising the material of claim 25, wherein the wafer includes a surface off-cut at an angle in a range of from about 0.2 to about 8 degrees toward 11-20 or 10-10 from a c-plane of said single crystal III-V nitride material.

35. A wafer comprising the material of claim 25, finished by a process including at least one of lapping, polishing and CMP.

36. A wafer comprising the material of claim 25, finished by a process including CMP.

37. A wafer comprising the material of claim 25, having at least one surface with a DDSDR of less than 50%.

38. A wafer comprising the material of claim 25, having at least one surface with a DDSDR of less than 25%.

39. A wafer comprising the material of claim 25, having at least one surface with a DDSDR of less than 10%.

40. A wafer comprising the material of claim 25, having at least one epitaxial layer thereon.

41. The wafer of claim 40, wherein said at least one epitaxial layer comprises a heteroepitaxial layer.

42. The wafer of claim 40, wherein said at least one epitaxial layer comprises a homoepitaxial layer.

43. An electronic device article including a wafer comprising the material of claim 25, and an electronic device structure fabricated on said wafer.

44. The electronic device article of claim 43, wherein the electronic device structure includes a laser diode.

45. The electronic device article of claim 43, wherein the electronic device structure includes a light-emitting diode.

46. The electronic device article of claim 43, wherein the electronic device structure includes a high electron mobility transistor.

47. The electronic device article of claim 43, wherein the electronic device structure comprises integrated circuitry.

48. The electronic device article of claim 43, wherein the electronic device structure includes an opto-electronic device.

49. Material according to claim 1, as grown under single crystal III-V nitride growth conditions slightly deviated from optimal single crystal III-V nitride growth conditions.

50. A wafer comprising material as claimed in claim 49.

* * * * *

UNITED STATES PATENT AND TRADEMARK OFFICE
CERTIFICATE OF CORRECTION

| | |
|---|---|
| PATENT NO. | : 7,323,256 B2 |
| APPLICATION NO. | : 10/712351 |
| DATED | : January 29, 2008 |
| INVENTOR(S) | : Xueping Xu |

Page 1 of 1

It is certified that error appears in the above-identified patent and that said Letters Patent is hereby corrected as shown below:

Column 19, line 53 (claim 23): "surface, including" should be -- surface including --.

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,323,256 B2  Page 1 of 1
APPLICATION NO. : 10/712351
DATED : January 29, 2008
INVENTOR(S) : Xueping Xu It is certified that error appears in the above-identified patent and that said Letters Patent is hereby corrected as shown below:

Column 1, Line 6, add:
-- GOVERNMENT RIGHTS IN INVENTION

The invention was made in the performance of U.S. Navy Contract Number N0001402C0321.
The U.S. Government has certain rights in the invention. --.

Signed and Sealed this
Twenty-fifth Day of January, 2011

David J. Kappos
*Director of the United States Patent and Trademark Office*